US010593261B2

(12) United States Patent
Kim et al.

(10) Patent No.: US 10,593,261 B2
(45) Date of Patent: Mar. 17, 2020

(54) DISPLAY DEVICE AND DRIVING METHOD THEREOF

(71) Applicant: LG Display Co., Ltd., Seoul (KR)

(72) Inventors: Taegung Kim, Paju-si (KR); Kyungrok Kim, Paju-si (KR); Jinhan Yoon, Gimhae-si (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 15/782,469

(22) Filed: Oct. 12, 2017

(65) Prior Publication Data

US 2018/0114483 A1    Apr. 26, 2018

(30) Foreign Application Priority Data

Oct. 25, 2016  (KR) .......................... 10-2016-0139527

(51) Int. Cl.
*G09G 3/3225*    (2016.01)
*H01L 27/32*    (2006.01)
*G09G 3/20*    (2006.01)

(52) U.S. Cl.
CPC ......... *G09G 3/3225* (2013.01); *G09G 3/2003* (2013.01); *H01L 27/3213* (2013.01); *H01L 27/3218* (2013.01); *H01L 27/3262* (2013.01); *G09G 2300/0452* (2013.01); *G09G 2320/046* (2013.01); *G09G 2320/06* (2013.01); *G09G 2320/0666* (2013.01); *G09G 2320/103* (2013.01); *G09G 2330/021* (2013.01); *G09G 2340/0457* (2013.01); *G09G 2340/0464* (2013.01)

(58) Field of Classification Search
None
See application file for complete search history.

(56) References Cited

U.S. PATENT DOCUMENTS

| 2005/0093850 | A1* | 5/2005 | Mori ...................... G09G 3/007 345/204 |
| 2014/0176620 | A1* | 6/2014 | Yano .................... G09G 3/3208 345/690 |
| 2014/0362127 | A1* | 12/2014 | Yang .................... G09G 3/2003 345/690 |
| 2015/0123953 | A1 | 5/2015 | Shim et al. |
| 2015/0138179 | A1 | 5/2015 | Park |
| 2015/0154908 | A1 | 6/2015 | Nam et al. |

(Continued)

FOREIGN PATENT DOCUMENTS

| KR | 10-1577907 B1 | 12/2015 |
| KR | 10-1581593 | 12/2015 |

(Continued)

*Primary Examiner* — Nitin Patel
*Assistant Examiner* — Amen Woldesenbet Bogale
(74) *Attorney, Agent, or Firm* — Fenwick & West LLP (57) ABSTRACT

A display device and a driving method of the display device are disclosed. The display device includes a display panel including a plurality of pixels, wherein each of the pixels is composed of three sub-pixels among a first color sub-pixel, a second color sub-pixel, a third color sub-pixel, and a fourth color sub-pixel, an image processing unit configured to change a color combination on a time axis in at least one of the pixels, and render sub-pixel data of an input image in the color combination, and a display panel driving circuit configured to write data received from the image processing unit to the pixels.

10 Claims, 11 Drawing Sheets

(56) References Cited

U.S. PATENT DOCUMENTS

| | | |
|---|---|---|
| 2015/0187268 A1 | 7/2015 | Tani et al. |
| 2015/0379937 A1 | 12/2015 | Kim et al. |
| 2016/0012798 A1 | 1/2016 | Oh et al. |
| 2016/0071445 A1 | 3/2016 | Kim et al. |
| 2017/0004764 A1 | 1/2017 | Kim et al. |

FOREIGN PATENT DOCUMENTS

| | | |
|---|---|---|
| KR | 10-2017-0010223 | 1/2017 |
| KR | 10-2017-0021406 | 2/2017 |
| KR | 10-2017-0023292 | 3/2017 |
| KR | 10-2017-0049667 | 5/2017 |
| KR | 10-2017-0064038 | 6/2017 |
| KR | 10-2017-0076952 | 7/2017 |
| KR | 10-2017-0078979 | 7/2017 |

\* cited by examiner

FIG. 1

(RELATED ART)

| Gray scale | Current (A) | Voltage (V) | Luminance (L) |
|---|---|---|---|
| 80 | 0.86 | 3 | 15.6 |
| 100 | 1.41 | 3.4 | 25.5 |
| 120 | 2.11 | 3.6 | 38.1 |
| 140 | 2.97 | 4.1 | 53.4 |
| 160 | 3.98 | 4.5 | 71.3 |
| 180 | 5.16 | 5 | 92.9 |
| 200 | 6.51 | 5.4 | 117.2 |
| 220 | 8.03 | 5.8 | 144.5 |

DISPLAY DEVICE AND DRIVING METHOD THEREOF

This application claims priority to Republic of Korea Patent Application No. 10-2016-0139527 filed on Oct. 25, 2016, the entire contents of which are incorporated herein by reference for all purposes as if fully set forth herein.

BACKGROUND

Field

The present disclosure relates to a display device that changes a color combination of sub-pixels in a pixel to prevent an afterimage and a driving method thereof.

Discussion of the Related Art

An active matrix organic light emitting diode display includes an organic light emitting diode (OLED) capable of emitting light by itself and has many advantages, such as a fast response time, a high emission efficiency, a high luminance, a wide viewing angle, and the like.

Each pixel of the organic light emitting diode display includes a driving element for controlling current flowing in the OLED. The driving element may be implemented as a thin film transistor (TFT). Though it is preferable that electrical characteristics of the driving element such as a threshold voltage, a mobility, etc. are designed to be the same in all pixels, the electrical characteristics of the driving TFT are not uniform due to process conditions, driving environment, and the like. As driving time becomes longer, the driving element receives a lot of stress and there is a stress difference depending on a data voltage. The electrical characteristics of the driving element are affected by the stress. Therefore, the electrical characteristics of the driving TFTs change as the driving time elapses.

Figure 1:
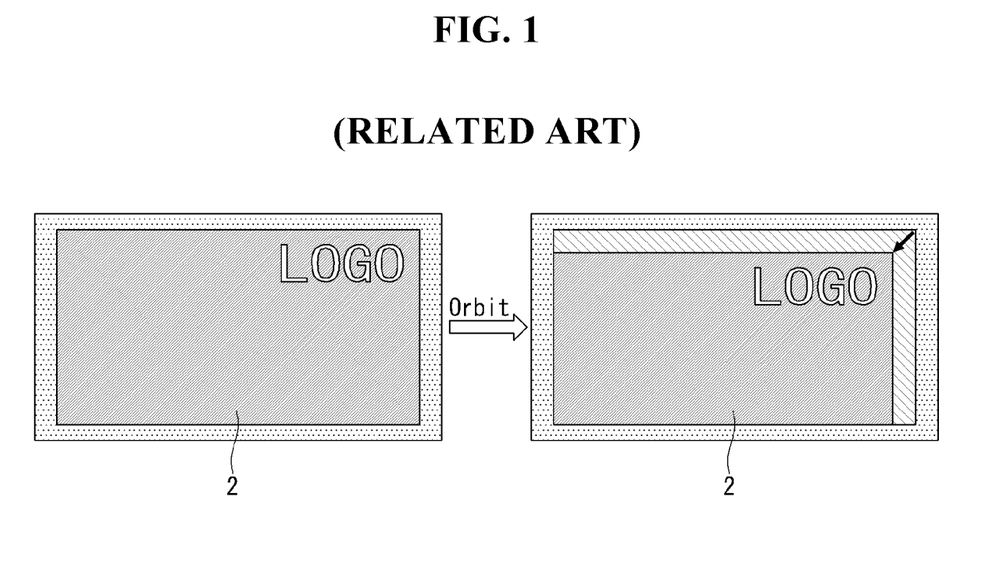
FIG. 1 is a diagram illustrating an example in which a screen is moved to prevent an afterimage in a fixed pattern in which a logo is displayed.

In the OLED display, when a specific screen is fixed and driven for a long time, some of the pixels among light emitting elements are deteriorated. The deterioration of these pixels is due to long-time current flow in specific pixels, and as the stress is increased to the pixels, a lifespan of the pixels is reduced, and luminance of the pixels is reduced. Due to these deteriorated pixels, it may display as a non-reconstructed afterimage or stain on the screen. In order to prevent such an afterimage, as shown in FIG. 1, there is a method of executing a predetermined orbit algorithm to move a screen 2 displayed with a fixed pattern in a specific time unit, for example, in one-minute intervals, to the left, right, up, down of the display. Even though the screen 2 is moved, if the area of a pattern causing the deterioration of the pixels is large, the stress dispersion effect can be small. In this case, there is a side effect that a bezel area appears to be enlarged when the screen 2 is moved. In this afterimage prevention method, the screen movement can be recognized by a user.

SUMMARY

The disclosure provides a display device and a driving method thereof that can disperse stress of pixels while maintaining resolution and luminance of a fixed pattern when displaying an image including the fixed pattern.

In one aspect, there is provided a display device including a display panel including a plurality of pixels, wherein each of the pixels is composed of three sub-pixels among a first color sub-pixel, a second color sub-pixel, a third color sub-pixel, and a fourth color sub-pixel, an image processing unit configured to change a color combination on a time axis in at least one of the pixels, and render sub-pixel data of an input image in the changed color combination, and a display panel driving circuit configured to write data received from the image processing unit to the pixels.

The image processing unit may compensate for a color which is not expressed by the at least one pixel with a color of another pixel adjacent to the at least one pixel.

The image processing unit may store a gray scale-current table storing a voltage depending on a gray scale of data of the input image and a current corresponding to the voltage, calculate an average current level (ACL) of one frame data based on the gray scale-current table, and render the sub-pixel data in a color combination for which the ACL is small among color combinations of the pixels.

The display device may further include a sensing unit that may sense deterioration of each of the sub-pixels.

The image processing unit may render the sub-pixel data in a color combination for which the average current level (ACL) is small in an area where the deterioration is large by analyzing deterioration information of the sub-pixels.

The image processing unit may render the sub-pixel data while changing the color combination within the pixel when a fixed pattern in the data of the input image is input for a predetermined time.

In another aspect, there is provided driving method of a display device including changing a color combination on a time axis in at least one of pixels, rendering sub-pixel data of an input image in the color combination that changes with time, and writing data rendered with the color combination to the pixels.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Advantages and features of the present disclosure and methods for accomplishing the same will become apparent with reference to embodiments described in detail below with reference to the accompanying drawings. However, the present disclosure is not limited to the embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout the description. In the following description, when a detailed description of well-known functions or configurations related to this document is determined to unnecessarily cloud a gist of the invention, the detailed description thereof will be omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

The terms "first", "second", etc. may be used to describe various components, but the components are not limited by such terms. These terms are only used to distinguish one component from another component.

Like reference numerals designate like elements throughout the description.

The features of various embodiments of the present disclosure can be partially combined or entirely combined with each other, and is technically capable of various interlocking and driving. The embodiments can be independently implemented, or can be implemented in conjunction with each other.

Hereinafter, preferred embodiments of the present disclosure will be described in detail with reference to the accompanying drawings. Like numbers refer to like elements throughout the specification. In the following description, when a detailed description of well-known functions or configurations related to this document is determined to unnecessarily cloud a gist of the invention, the detailed description thereof will be omitted.

A display device according to an embodiment of the disclosure will be described mainly in the following embodiments with reference to an OLED display, but is not limited thereto. For example, the disclosure is also applicable to a display device such as a liquid crystal display (LCD) in which an afterimage can be seen when a fixed pattern such as a logo is displayed for a long time.

Figure 2:
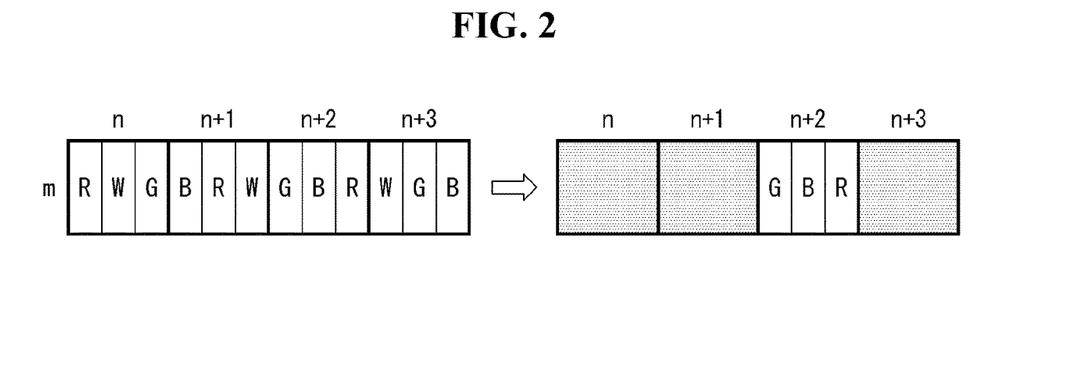
FIG. 2 is a diagram illustrating an example in which one pixel is implemented by three color sub-pixels among four color sub-pixels according to one embodiment of the present disclosure.

As shown in FIG. 2, the display device according to an embodiment of the disclosure includes a red sub-pixel (hereinafter, referred to as a R sub-pixel), a green sub-pixel (hereinafter, referred to as a G sub-pixel), a blue sub-pixel (hereinafter, referred to as a B sub-pixel), and a white sub-pixel (hereinafter, referred to as a W sub-pixel). In the display device of the disclosure, one pixel is rendered with three sub-pixels. Compared to an instance where one pixel is composed of four sub-pixels, when one pixel is composed of three sub-pixels, an amount of current flowing in the sub-pixels in the pixel is large, so that more stress is applied.

FIG. 2 illustrates nth (n is a positive integer) to (n+3)th pixels (n to n+3) arranged in an mth (m is a positive integer) line of a display panel. The nth pixel n includes the R sub-pixel, the W sub-pixel, and the G sub-pixel. The (n+1)th pixel includes the B sub-pixel, the R sub-pixel, and the W sub-pixel. The right drawing of FIG. 2 is an example in which only the (n+2)th pixel is turned on and remaining pixels (n, n+1, n+3th pixels) are turned off due to a fixed pattern of an input image.

The display device of the disclosure changes a color combination on a time axis in at least one of pixels, and includes an image processing unit for rendering sub-pixel data of an input image in a selected color combination and a display panel driving circuit for writing data received from the image processing unit to the pixels. The display panel driving circuit includes a source driver IC and a gate driver.

Figure 3:
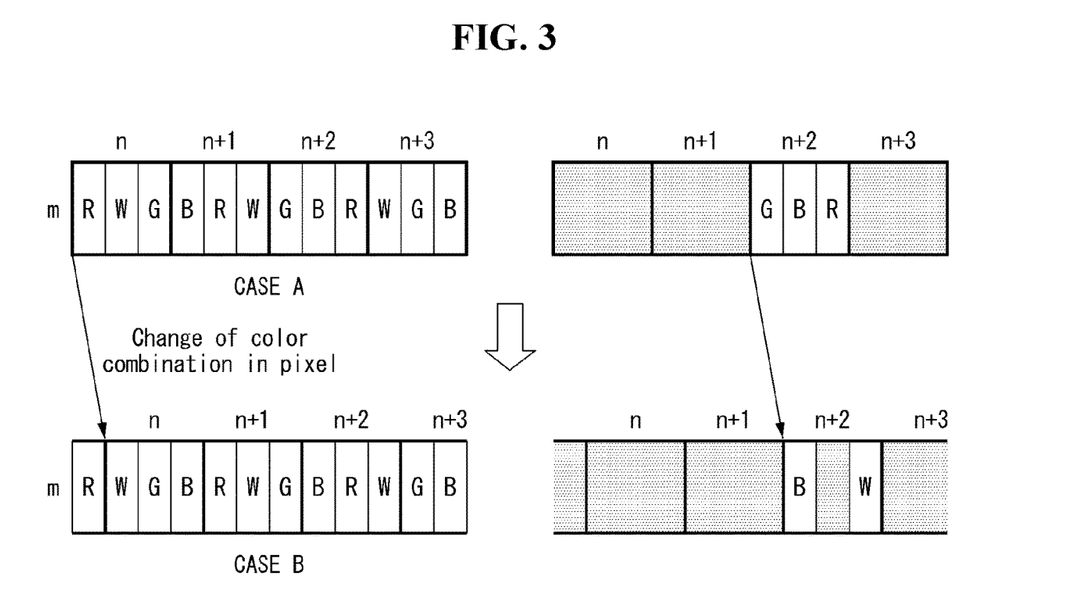
FIGS. 3 and 4 are diagrams illustrating a one sub-pixel shift in a pixel in the pixel arrangement shown in FIG. 2 according to one embodiment of the present disclosure.

The display device of the disclosure changes the color combination in the pixels on the time axis to disperse stress of the sub-pixels that are emitted for a long time due to the fixed pattern. For example, as shown in FIG. 3, the nth pixel n may be rendered as RWG sub-pixels (CASE A) at a first time point and when the sub-pixel data in the pixel is shifted to the right (or left) by one sub-pixel, the nth pixel may be rendered as WGB sub-pixels (CASE B) at a second time point. The (n+1)th pixel (n+1) is rendered as BRW sub-pixels (CASE A) at the first time point and when the sub-pixel data in the pixel is shifted to the right (or left) by one sub-pixel, the (n+1)th pixel may be rendered as RWG sub-pixels (CASE B) at the second time point. In the right side of the drawing of FIG. 3, after GBR sub-pixels (CASE A) of the (n+2)th pixel (n+2) emit light to express a white color at a first time point, and when moving to the right by one sub-pixel in a BRW sub-pixel combination, the B and W sub-pixels emit light to express a white color at a second time point. Thus, the color combination of the sub-pixels is changed over time to express pixel data with substantially the same color and luminance as those before the change in color combination without accumulation of stress of the sub-pixels.

Figure 4:
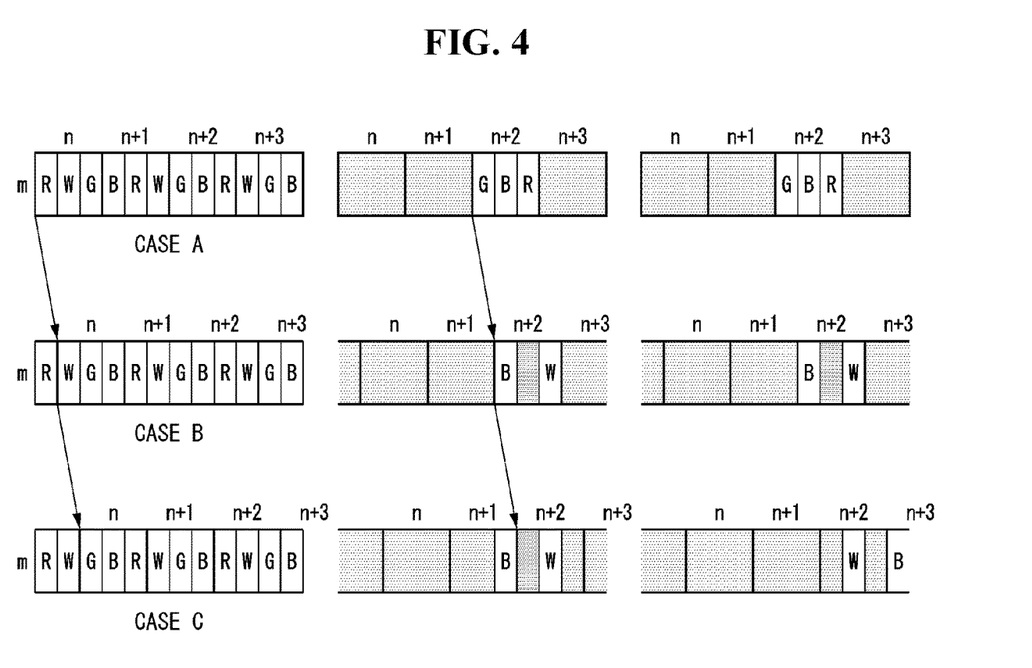

In an example of FIG. 4, the nth pixel (n) is rendered as RWG sub-pixels (CASE A) at a first time point, then rendered as WGB sub-pixels (CASE B) at a second time point, then rendered as GBR sub-pixels (CASE C) at a third time point. The (n+1)th pixel (n+1) is rendered as BRW sub-pixels (CASE A) at the first time point, then rendered as RWG sub-pixels (CASE B) at the second time point, then rendered as WGB sub-pixels (CASE C) at the third time point.

When viewed on the time axis due to movement of the sub-pixel data, a sub-pixel can be shifted by one sub-pixel and shifted by a maximum of three sub-pixels. When the nth pixel (n) is RWG sub-pixels (CASE A) at the first time point, it is moved to the right by one sub-pixel at the second time point and rendered as WGB sub-pixels (CASE B). When the nth pixel (n) is RWG sub-pixels (CASE A) at the first time point, it is moved to the right by two sub-pixels at the second time point and rendered as GBR sub-pixels (CASE C). When the nth pixel (n) is RWG sub-pixels (CASE A) at the first time point, it is moved to the right by three sub-pixels at the second time point and rendered as BRW sub-pixels (not shown).

Figure 5:
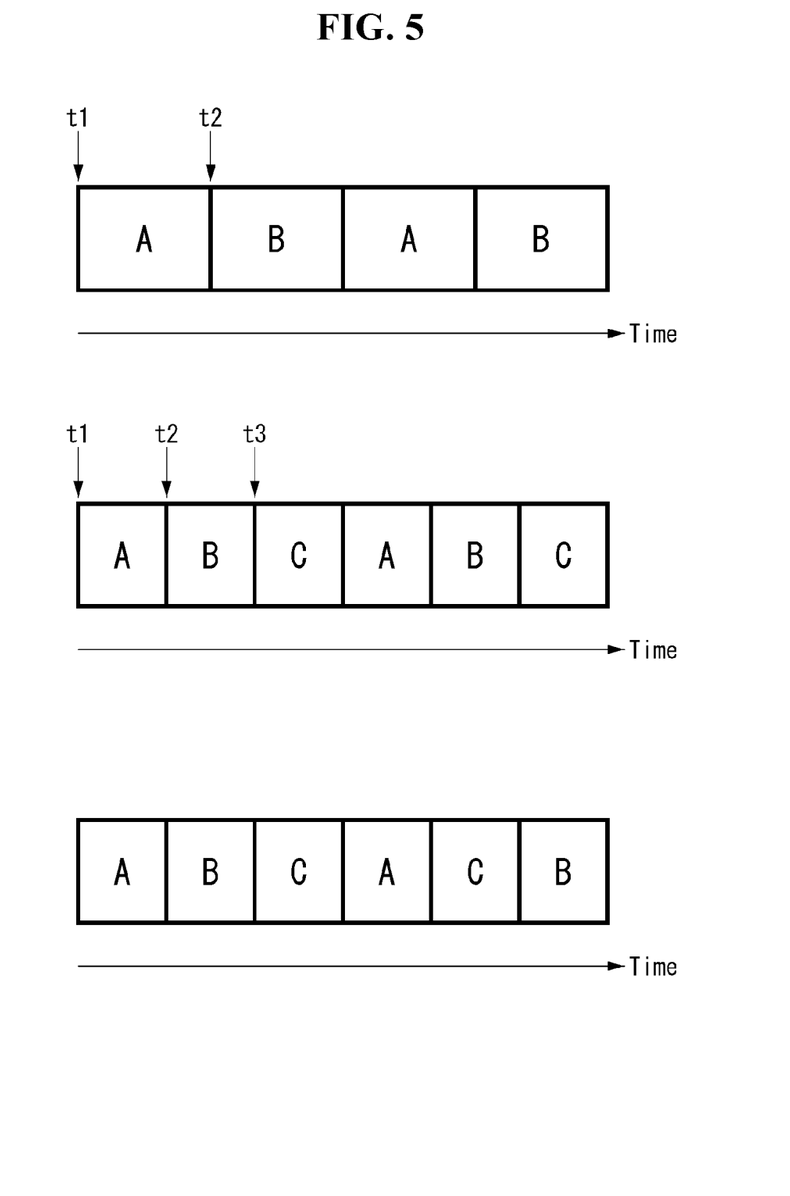
FIG. 5 is a diagram illustrating an example in which a sub-pixel combination is changed on a time axis according to one embodiment of the present disclosure.

When a sub-pixel rendering a pixel changes into CASE A, CASE B, and CASE C, as shown in FIG. 5, the embodiment of the disclosure controls the sub-pixel rendering of the pixel at the first time point t1 to the CASE A and controls the sub-pixel rendering of the pixel at the second point of time t2 to the CASE B, so that the CASE A and CASE B can be alternately combined. In addition, the sub-pixel rendering can be combined in order of CASE A, CASE B, and CASE C, or the sub-pixel rendering can be controlled in an irregular order.

The color combination of the pixels can be changed at a preset time. For example, the color combination can be changed in a time unit such as a frame period unit, a second unit, a minute unit, and the like. When the color combination of the pixels is changed every frame, stress of the sub-pixels is dispersed because a position of the emitted sub-pixel in every frame is changed. When a time period of the color combination change is short, the color combination is changed in a short time and a user does not recognize the change in position of the sub-pixel. When the time period of the color combination change is long, various color combinations can be changed in vertical and horizontal directions.

The embodiment of the disclosure moves sub-pixel data by one to three sub-pixels within a pixel and displays a fixed pattern with substantially the same luminance and chromaticity as those before change in the color combination without accumulation of stress of the sub-pixels. Therefore, the movement amount of the fixed pattern is very small, and there is hardly a change in a luminance of the fixed pattern or a difference in color feeling. Therefore, the embodiment of the disclosure disperses the stress of the pixels displaying the fixed pattern while the user does not recognize a resolution, a luminance, a color change, etc. of the fixed pattern displayed on a screen. The embodiment of the disclosure can also apply a method of moving sub-pixel data within a pixel and moving the screen 2 at predetermined time intervals as shown in FIG. 1.

Figure 6:
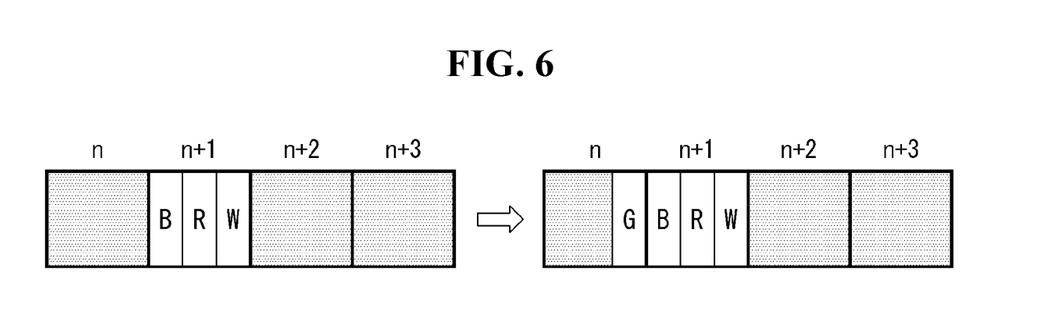
FIG. 6 is a diagram illustrating an example of a sub-pixel rendering method according to an embodiment of the present disclosure.

In the embodiment of the disclosure, the pixels emit light in combination of four sub-pixels such as RWG, BRW, GBR, and WGB to express one pixel data. The sub-pixel rendering method of the disclosure emits sub-pixels of three colors among four color sub-pixels to express one pixel. A color of light which cannot be expressed by the four sub-pixel combinations is compensated with a color of light emitted from an adjacent pixel n as shown in FIG. 6.

Figure 7:
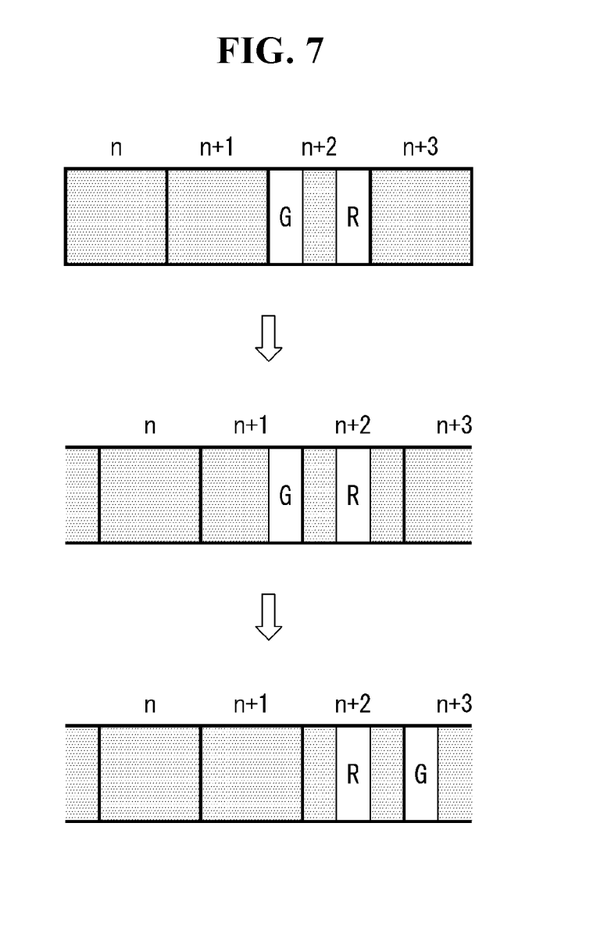
FIG. 7 is a diagram illustrating a method of expressing the same color in the same fixed pattern when a combination of sub-pixels in a pixel is changed using a sub-pixel rendering method according to an embodiment of the present disclosure.

In an example of FIG. 7, the (n+2)th pixel (n+2) expresses yellow as emission of G and R sub-pixels in the GBR sub-pixel combination. In an instance in which pixels are shifted by one sub-pixel, when the G sub-pixel of the (n+1)th pixel (n+1) and the R sub-pixel of the (n+2)th pixel (n+2) are emitted to express yellow color, and when the R sub-pixel of the (n+2)th pixel (n+2) and the G sub-pixel of the (n+3)th pixel (n+3) are emitted to express yellow, the stress of the sub-pixels is dispersed while expressing the same color.

Figure 8:
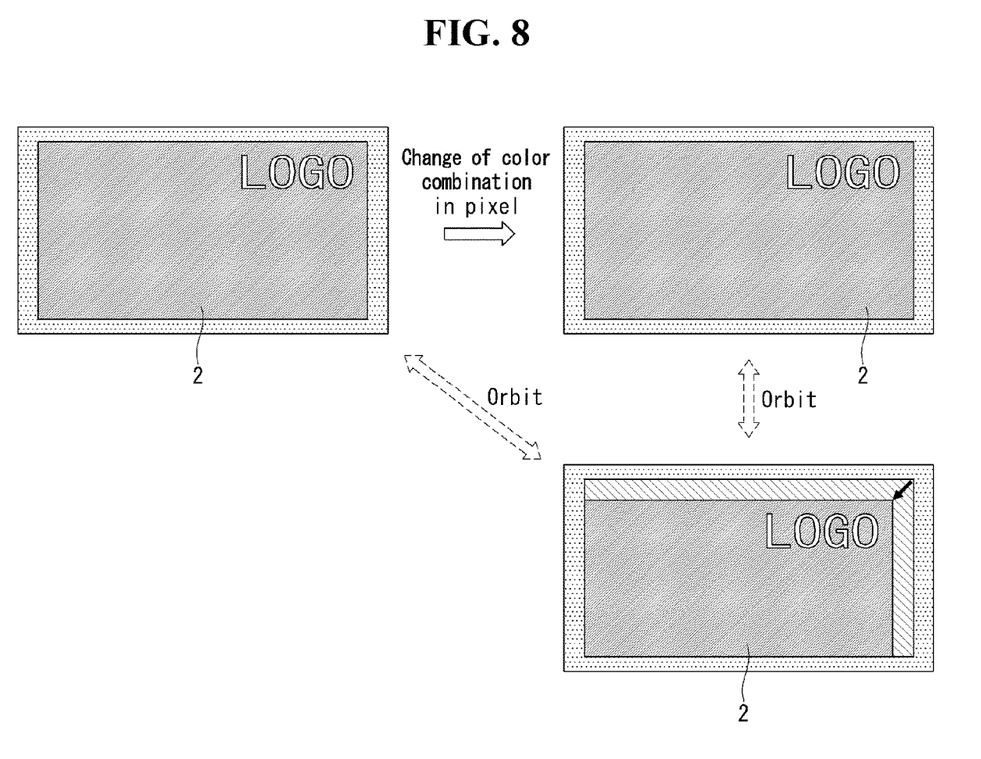
FIG. 8 is a diagram illustrating a screen viewed by a user when a fixed pattern image including a logo is displayed on a display device according to an embodiment of the present disclosure.

FIG. 8 is a diagram illustrating a screen viewed by a user when a fixed pattern image including a logo is displayed on a display device according to an embodiment of the disclosure.

Referring to FIG. 8, the embodiment of the disclosure changes a color combination of sub-pixels in each of pixels to disperse stress of the sub-pixels, and displays a fixed pattern, such as a logo, with the same color and the same luminance. A user can not recognize movement of the fixed pattern because the fixed pattern is moved within one pixel. The embodiment of the invention can increase stress dispersion effect by applying the screen moving method as shown in FIG. 1 together with stress dispersion method of the sub-pixels in the fixed pattern.

The embodiment of the disclosure changes the color combination of the sub-pixels in the pixel by changing a sub-pixel data transmission order using the sub-pixel rendering algorithm. The method in which the color combinations of the sub-pixels are changed within the pixel can obtain an effect that the pixels are shifted in a sub-pixel unit.

Figure 9:
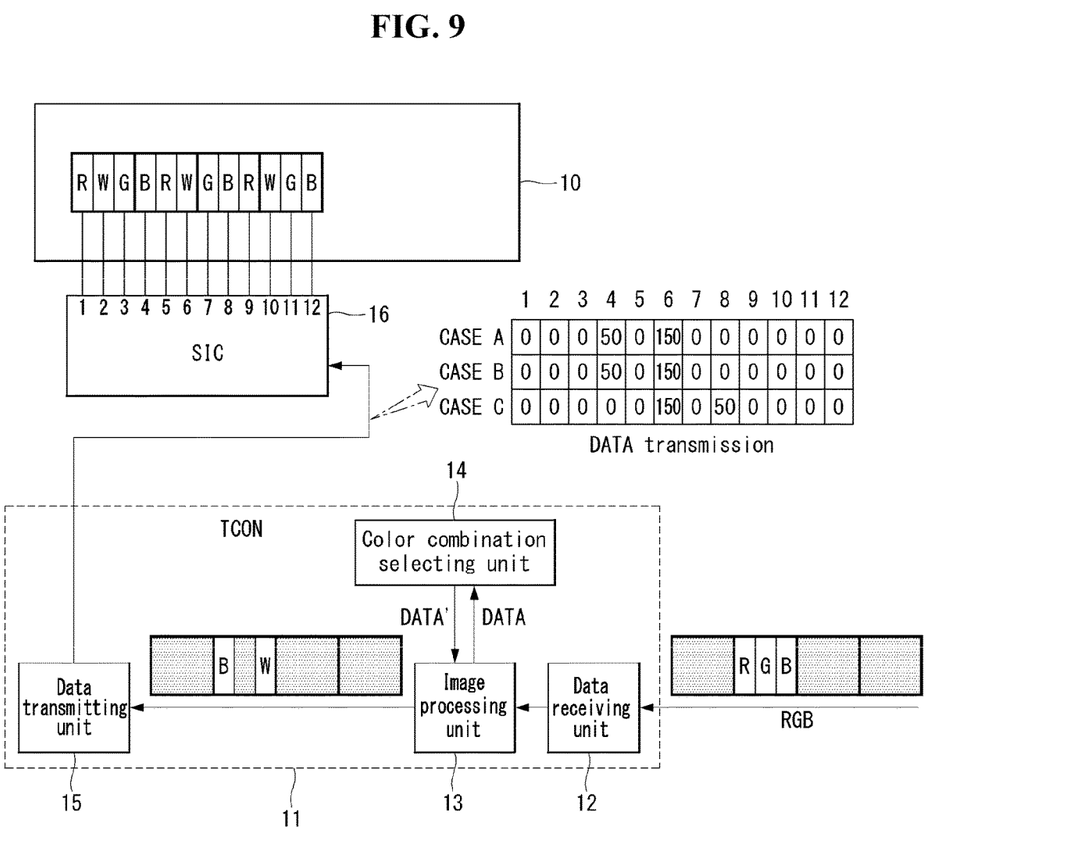
FIG. 9 is a diagram illustrating an image processing method in a display device according to an embodiment of the present disclosure.

FIG. 9 is a diagram illustrating an image processing method in a display device according to an embodiment of the disclosure.

Referring to FIG. 9, a timing controller 11 rearranges data of an input image and transmits the data to a source driver IC (SIC) 16.

The timing controller 11 includes a data receiving unit 12, an image processing unit 13, a color combination selecting unit 14, a data transmitting unit 15, and the like. The timing controller 11 may transmit the data to the source driver IC 16 through an EPI interface.

A host system may transmit 10-bit pixel data of the input image to the timing controller 11. The data receiving unit 12 of the timing controller 11 transmits the data of the input image received from the host system to the image processing unit 13. The image processing unit 13 transmits the data DATA of the input image to the color combination selecting unit 14.

The color combination selecting unit 14 transmits color combinations DATA' (CASE A, CASE B, and CASE C) in pixels to the image processing unit 13 in a predetermined order.

The image processing unit 13 renders sub-pixel data of the input image in the color combinations (CASE A, CASE B, and CASE C) received from the color combination selecting unit 14 when an image including a fixed pattern is input, to select a color combination in which luminance and color are not changed and stress is dispersed. An example of FIG. 9 is an example of expressing white data by color combinations of CASE A, CASE B, and CASE C when pixel data received in the timing controller 11 is white gray scale data to be displayed in an (n+1)th pixel. Data of the CASE A may be transmitted to the source driver IC 16 at a first time point t1. Data of the CASE B may be transmitted to the source driver IC 16 at a second time point t2 and data of the CASE C may be transmitted to the source driver IC 16 at a third time point t3.

Figure 10:
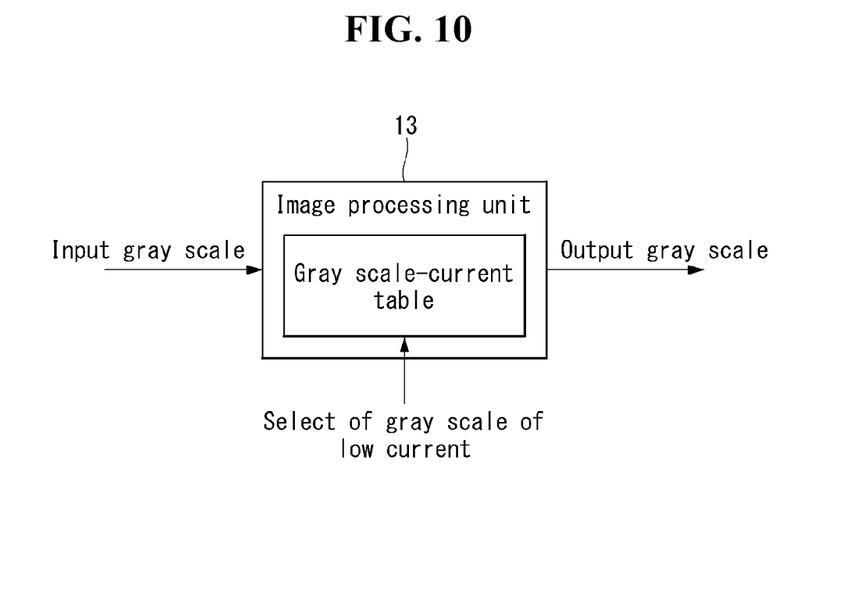
FIG. 10 is a diagram illustrating a gray scale-current table of a image processing unit according to an embodiment of the present disclosure.
Figure 11:
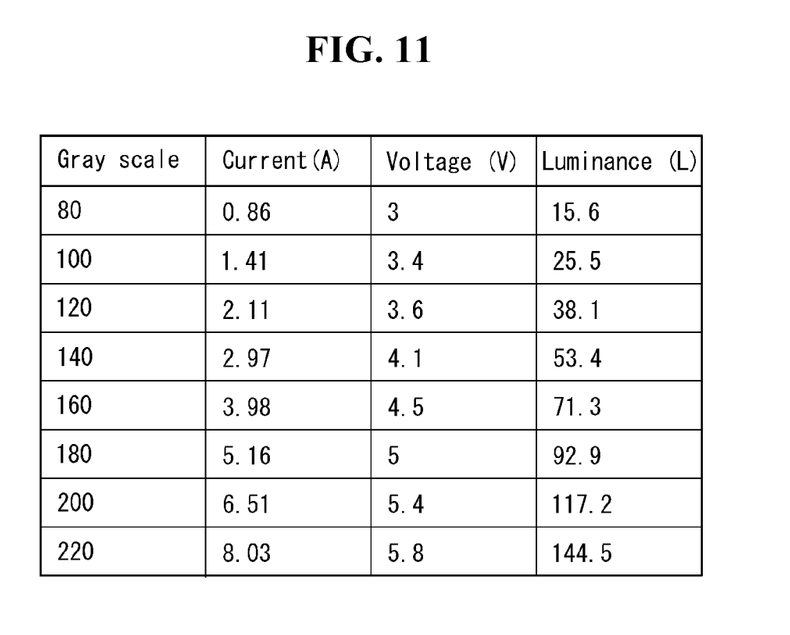
FIG. 11 is a diagram illustrating an example of a gray scale-current table.

A gray scale-current table shown in FIG. 10 and FIG. 11 may be stored in the image processing unit 13. The image processing unit 13 inputs the data of the input image into a look-up table in which the gray scale-current table is set and selects a gray scale of data with a combination of gray scale having low current consumption in the same or similar luminance, so that the image processing unit 13 can modulate the data of the input image.

Results of measuring a voltage depending on an input gray scale and a current corresponding to the voltage before shipment of the display device are stored in the gray scale-current table. When the data of the input image is received from the host system to the timing controller 11, the timing controller 11 calculates currents of all the pixels depending on input gray scales of one frame data and determines them as an average current level (ACL). In an instance of pixel data expressing the same white, the average current level (ACL) varies depending on the color combination of the sub-pixels. When white is displayed, a color arrangement including white sub-pixels can further reduce the current consumption than a color arrangement that does not include the white sub-pixels. The embodiment of the disclosure renders sub-pixel data in a color combination, the average current level (ACL) of which is small among the color combinations (CASE A, CASE B, CASE C) of the pixels in the fixed pattern such as a logo, so that the embodiment of the disclosure can disperse stress at the same luminance and reduce power consumption by selecting a color arrangement with low current consumption. The method of selecting the color arrangement with the low current consumption may be applied to one frame data of an entire screen or to some area (fixed pattern) causing deterioration of the pixels.

The image processing unit 13 determines a still image including a fixed pattern such as a logo by comparing and analyzing data of an input image between frames, and when the still image data is input, the image processing unit 13 can change a combination of sub-pixel data in a color arrangement in which current consumption is low. When pixel data whose gray scale difference between the frame data continuously inputted to the timing controller 11 is larger than a predetermined threshold value is 2% or more of the entire pixels, it can be determined as moving image data. When the pixel data is less than 2%, it can be determined as still image data. The image processing unit 13 may render the sub-pixel data while changing the color combination within the pixel in the still image in which the fixed pattern in the data of the input image is input for a predetermined time. The image processing unit 13 may render the sub-pixel data in a fixed color combination in each of the pixels when the image data other than the still image is received.

The display device of the disclosure can sense deterioration of the sub-pixels and change the color combination of pixels on the time axis based on the sensed result. Here, sensing the deterioration means sensing deterioration of each of the sub-pixels based on data accumulation result of each sub-pixel as a result of data analysis of the input image and sensing deterioration of the sub-pixels based on a sensed result of feedback from the sub-pixels of the display panel. The former can be executed in the image processing unit 13, and the latter can use a circuit shown in FIG. 12.

The embodiment of the disclosure senses driving characteristics of each of the sub-pixels to determine deterioration of each of the sub-pixels, and changes the color combination of pixels based on the deterioration of sub-pixels. Therefore, the embodiment of the disclosure can drive a sub-pixel which is relatively less deteriorated by avoiding a sub-pixel with severe deterioration. The embodiment of the disclosure minimizes additional stress on sub-pixels with severe deterioration, thereby improving the lifespan as well as preventing the afterimage of the display device.

The driving characteristics of the sub-pixel include a threshold voltage, a mobility, and the like of the light emitting element OLED and the driving element of the pixel. A degree of deterioration of each of the sub-pixels can be determined based on an amount of change in the threshold voltage and mobility. The embodiment of the disclosure can sense driving characteristics of the sub-pixels formed on the display panel 10 using a sensing unit 26 as shown in FIGS. 12 and 13.

Figure 12:
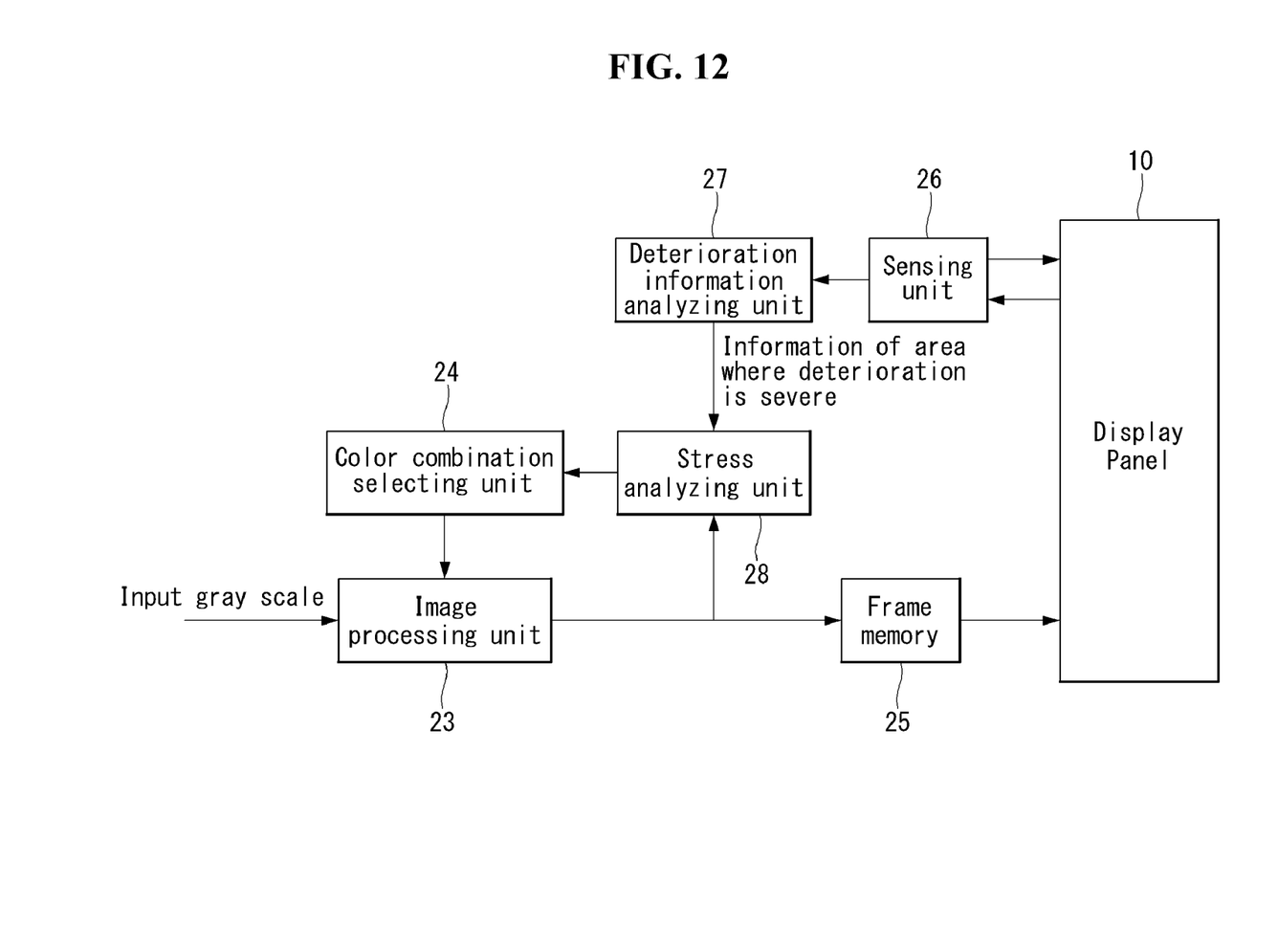
FIGS. 12 and 13 are diagrams illustrating a sensing path for sensing a degree of deterioration of a sub-pixel in a display device according to an embodiment of the present disclosure.
Figure 13:
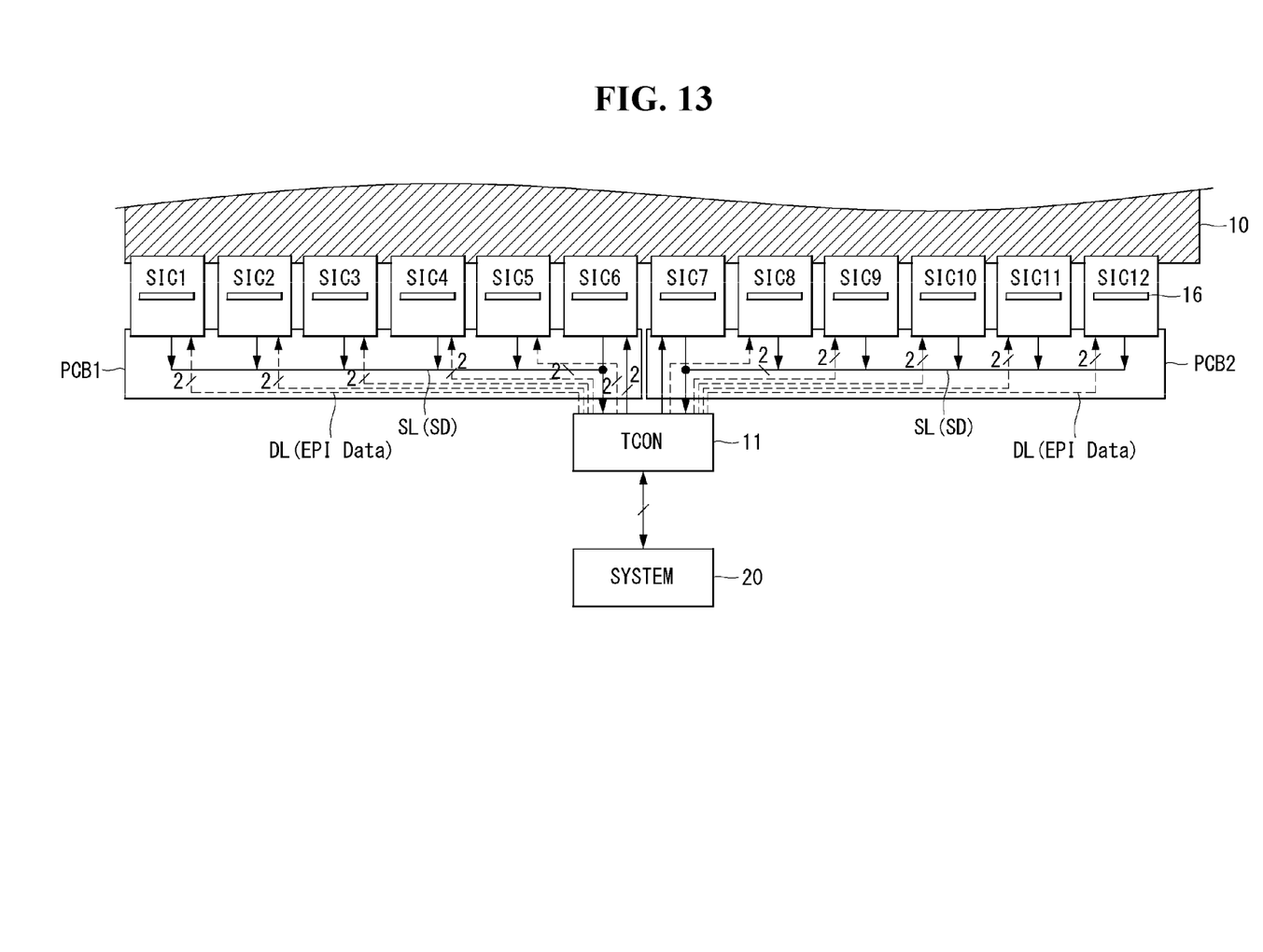

Referring to FIG. 12, the display device according to an embodiment of the disclosure further includes frame memory 25, a sensing unit 26, a deterioration information analyzing unit 27, a stress analyzing unit 28, a color combination selecting unit 24, an image processing unit 23, and the like.

The sensing unit 26 senses a current or a voltage in each of the sub-pixels and converts the sensed current or voltage into digital data. The deterioration information analyzing unit 27 analyzes the sensed data of each of the sub-pixels inputted through the sensing unit 26, and detects a local area having a greatest deterioration in a screen. Generally, the local area having the greatest deterioration is an area where a logo is continuously displayed, which may be an upper corner area of the screen, but it is not limited thereto because it may vary depending on a logo/caption position of the input image. The stress analyzing unit 28 calculates an average current level (ACL) of an image to be displayed in the local area where the deterioration is severe. Since a current flowing through the pixel differs depending on the gray scale of the input image and the color combination of the sub-pixels, the average current level (ACL) of the local area varies depending on the input image and the color combination of the sub-pixels in the pixel.

The color combination selecting unit 24 selects a color combination having a smallest average current level (ACL) in the local area where the deterioration is severe and transmits the selected color combination to the image processing unit 23. The image processing unit 23 renders the sub-pixel data of the input image in the color combination selected by the color combination selecting unit 24 when an image including a fixed pattern such as a logo/caption is input. Output data of the image processing unit 23 is transmitted to the source driver IC through the frame memory 25. The source driver IC can convert the input data into a data voltage and output it to the data lines of the display panel 10.

Figure 14:
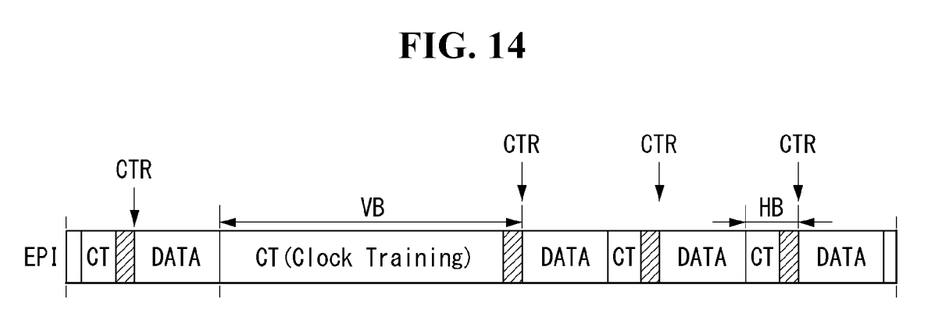
FIG. 14 is a diagram illustrating signals transmitted from a timing controller to a source driver IC shown in FIG. 13 according to an embodiment of the present disclosure.

FIG. 13 is a diagram illustrating wiring connections between a timing controller 11 and source driver ICs 16 in a display device according to an embodiment of the disclosure. FIG. 14 is a diagram illustrating a signal format of an EPI interface protocol.

Referring to FIGS. 13 and 14, an EPI interface connects a transmitting end of the timing controller 11 and a receiving end of the source driver ICs 16 through a data bus pair. The EPI interface does not require a separate clock bus pair between the timing controller 11 and the source driver ICs 16. The timing controller 11 transmits a clock signal, a control data packet, and a data packet including pixel data (hereinafter, referred to as video data) of an input image together to the source driver ICs 16 through the data bus pair DL.

A recovery circuit for clock and data recovery (CDR) is embedded in each of the source driver ICs 16 in order to implement the EPI interface. The timing controller 11 transmits a clock training pattern signal or a preamble signal CT to the source driver ICs 16 so that output phase and frequency of the recovery circuit can be locked. The recovery circuit embedded in the source driver ICs 16 generates an internal clock when the clock training pattern signal CT and the clock signal are input through the data bus pair DL.

In the EPI interface protocol, the timing controller 11 transmits the clock training pattern signal CT to the source driver ICs before transmitting the control data and video data of the input image. The recovery circuit of the source driver ICs locks stably phase and frequency of a recovered internal clock by performing a clock training (CT) operation according to the preamble signal. Data link in which the data of the input image are transmitted between the source driver ICs 16 and the timing controller 11 is established after the phase and frequency of the internal clock are stably locked. The timing controller 11 starts transmitting the control data and video data to the source driver ICs 16 after a lock signal received from a last source driver IC 16 is received.

When the output phase and frequency of the embedded recovery circuit in any one of the source driver ICs are unlocked, the source driver IC 16 inverts the lock signal transmitted to the timing controller 11 to a low logic level. The last source driver IC 16 transmits a lock signal inverted to the low logic level to the timing controller 11. The timing controller 11 retransmits the clock training pattern signal CT to the source driver ICs 16 so that the clock training of the source driver ICs 16 is resumed when the lock signal is inverted to the low logic level.

The display device according to an embodiment of the disclosure includes the display panel 10, the timing controller 11, and the source driver ICs 16. In FIG. 13, a gate driving circuit (or scan driving circuit) is omitted. In FIG. 13, "TCON" represents a timing controller, and "SYSTEM" represents a host system. "SIC1 to SIC12" is an example of 12 source driver ICs. The number of source driver ICs is one or more, but is not limited to twelve.

A screen of the display panel 10 includes a pixel array. The pixel array includes pixels arranged in a matrix form by an intersection structure of data lines and gate lines. The pixel array further includes sensing lines connected to the pixels.

The sensing unit 26 includes an analog-to-digital converter (ADC) and may be disposed in the display panel 10 and the source driver ICs 16. The ADC is connected to the sensing lines. Touch sensors for implementing a touch user interface (UI) may be embedded in the pixel array.

A method of sensing deterioration of sub-pixels using the sensing unit 26 can use a voltage sensing method of a driving TFT that is disclosed in Korean Patent Application No. 10-2013-0134256 (Nov. 11, 2013), Korean Patent Application No. 10-2013-0141334 (Nov. 20, 2013), Korean Patent Application No. 10-2013-0149395 (Dec. 3, 2013), Korean Patent Application No. 10-2013-0166678 (Dec. 30, 2013), Korean Patent Application No. 10-2014-0115972 (Sep. 2, 2014), Korean Patent Application No. 10-2015-0101228 (Jul. 16, 2015), Korean Patent Application 10-2015-0093654 (Jun. 30, 2015), Korean Patent Application 10-2015-0149284 (Oct. 27, 2015), etc., a current sensing method of a driving TFT that is disclosed in Korean Patent Application 10-2014-0079255 (Jun. 26, 2014), Korean Patent Application 10-2015-0186683 (Dec. 24, 2015), Korean Patent Application 10-2015-0168424 (Nov. 30, 2015), etc., and a driving characteristic sensing method of an OLED that is disclosed in Korean Patent Application 10-2014-0086901 (Jul. 10, 2014), Korean Patent Application 10-2014-0119357 (Sep. 5, 2014), Korean Patent Application 10-2014-0175191 (Dec. 8, 2014), Korean Patent Application 10-2015-0115423 (Aug. 17, 2015), Korean Patent Application 10-2015-0188928 (Dec. 29, 2015), Korean Patent Application 10-2015-0117226 (Aug. 20, 2015), etc.

The source driver ICs 16 may receive data from the timing controller 11 through the EPI interface, and transmit sensing data (ADC data) to the timing controller 11 through a separate ADC data bus pair SL. The source driver ICs 16 may update a sensing timing signal in response to an instruction code of the control data packet received from the timing controller 11.

The timing controller 11 and the source driver ICs 16 are connected through the EPI data bus pair DL and also through the ADC data bus pair SL. The ADC data is digital data obtained as a result of driving characteristic sensing of a pixel. The EPI data bus pair DL is connected in a point-to-point manner by connecting the timing controller 11 and the source driver ICs 16 in a 1:1 relationship.

The timing controller 11 serially transmits the clock training pattern or preamble CT, the control data packet CTR and the video data packet DATA to the source driver ICs 16 in sequence through the EPI data bus pair DL according to the EPI interface protocol as shown in FIG. 14.

In FIG. 14, "VB" is a vertical blank period and "HB" is a horizontal blank period. The vertical blank period VB is a blank period until an (N+1)th frame data is input between an Nth (N is a positive integer) frame period and the (N+1)th frame period. The horizontal blank period HB is a blank period between an Nth line data and an (N+1)th line data. The Nth line data are data to be written to pixels arranged in an Nth horizontal line of the display panel 10. The (N+1)th line data are data to be written to pixels arranged in an (N+1)th horizontal line of the display panel 10.

Data received through the EPI data bus pair DL includes a clock PCLK. The data is transmitted to the source driver ICs 16 through the EPI data bus pair DL together with the clock.

The control data packet transmitted through the EPI data bus pair DL includes source control data for controlling operation timing of the source driver ICs 16, an option signal, and a sensing timing signal for controlling operation of a sensing circuit. The option signal may include various optional signals of the gate driving circuit and the source driver ICs, such as a gate start pulse (GSP) for controlling a shift register start timing of the gate driving circuit (scan driving circuit), a skew option signal of the source driver IC, a power option signal, and various optional signals, such as an instruction code that defines an update period of the sensing timing signal. A gate timing signal for controlling driving timing of the gate driving circuit (scan driving circuit) may be transmitted to the gate driving circuit through a separate wiring.

The sensing unit 26 includes a sensing wiring connected to the sub-pixels, a switching element connected to the sensing wiring, an ADC, an integrator, and the like. The source driver ICs 16 may include a part of the sensing circuit, e.g., the ADC, the integrator, and the like. The gate driving circuit operates as a sensing circuit for generating a scan signal necessary for a sensing operation in a sensing mode and operates as a scan driving circuit for selecting pixels to which data of an input image is written in a driving mode.

The ADC data bus pair SL can connect the timing controller 11 to the plurality of source driver ICs 16 in parallel. For example, the source driver ICs 16 connected to a first PCB PCB1 are connected to the timing controller 11 through a first ADC data bus pair SL. The source driver ICs 16 connected to a second PCB PCB2 are connected to the timing controller 11 through a second ADC data bus pair SL.

The source driver ICs 16 transmits ADC output data to the timing controller 11 through the ADC data bus pair SL. The ADC output data is sensing data indicating a degree of deterioration of the sub-pixels.

The timing controller 11 transmits the data of the input image from the host system 20 to the source driver ICs 16 so as to satisfy the EPI interface protocol. The timing controller 11 may encode the sensing timing signal in the control data packet. The sensing timing signal may include a plurality of signals for individually controlling a plurality of elements.

The host system 20 may be any one of a television system, a set-top box, a navigation system, a computer, a DVD player, a Blu-ray player, a home theater system, and a phone system. The host system transmits to the timing controller 11 the timing signals synchronized with the data of the input image. The timing signals include a vertical synchronization signal Vsync, a horizontal synchronization signal Hsync, a data enable signal DE, a main clock MCLK, and the like.

As described above, the embodiment of the disclosure renders the sub-pixel data in the selected color combination while changing the color combination of the pixels on the time axis, so that the embodiment of the disclosure can disperse the stress of the pixels while maintaining the resolution and the luminance of the fixed pattern when displaying the image including the fixed pattern. Furthermore, the embodiment of the invention reduces the deterioration of the pixels to improve the lifespan and image quality of the display device, and can reduce the power consumption by selecting the color combination having the low current consumption.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel including a plurality of pixels, wherein each of the pixels is composed of three sub-pixels among a first color sub-pixel, a second color sub-pixel, a third color sub-pixel, and a fourth color sub-pixel;
    an image processing unit configured to change a color combination in at least one pixel of the pixels when an input image is input with a fixed pattern for a predetermined time, and render sub-pixel data of the input image in the changed color combination; and
    a display panel driving circuit configured to write data received from the image processing unit to the plurality of pixels,
    wherein the image processing unit is further configured to:
        store a gray scale-current table storing a voltage depending on a gray scale of data of the input image and a current corresponding to the voltage,
        calculate an average current level (ACL) of one frame data based on the gray scale-current table, and
        render the sub-pixel data in a color combination for which the ACL is smallest among color combinations of the plurality of pixels.

2. The display device of claim 1, wherein the image processing unit is configured to compensate for a color which is not expressed by the at least one pixel with a color of another pixel adjacent to the at least one pixel.

3. The display device of claim 1, further comprising:
    a sensing unit configured to sense deterioration of each of the sub-pixels in the plurality of pixels,
    wherein the image processing unit is configured to render the sub-pixel data in a color combination for which an average current level (ACL) is smallest in an area where the deterioration is largest by analyzing deterioration information of the sub-pixels.

4. The display device of claim 1, wherein the image processing unit is configured to change the color combination in a time unit.

5. The display device of claim 4, wherein the time unit is a frame period unit, a second unit, or a minute unit.

6. A driving method of a display device including a display panel including a plurality of pixels, wherein each of the pixels is composed of three sub-pixels among a first color sub-pixel, a second color sub-pixel, a third color sub-pixel, and a fourth color sub-pixel, comprising:
    changing a color combination in at least one pixel of the plurality of pixels when an input image is input with a fixed pattern for a predetermined time;
    rendering sub-pixel data of the input image in the changed color combination; and
    writing data rendered with the changed color combination to the plurality of pixels,
    wherein the driving method further comprises:
    providing a gray scale-current table storing a voltage depending on a gray scale of data of the input image and a current corresponding to the voltage;
    calculating an average current level (ACL) of one frame data based on the gray scale-current table, and
    rendering the sub-pixel data in a color combination for which the ACL is smallest among color combinations of the plurality of pixels.

7. The driving method of claim 6, further comprising:
    compensating for a color which is not expressed by the at least one pixel with a color of another pixel adjacent to the at least one pixel.

8. The driving method of claim 6, further comprising:
    sensing deterioration of each of the sub-pixels of the plurality of pixels; and
    rendering the sub-pixel data in a color combination for which an average current level (ACL) is smallest in an area where the deterioration is largest by analyzing deterioration information of the sub-pixels.

9. The driving method of claim 6, wherein the color combination is changed in a time unit.

10. The driving method of claim 9, wherein the time unit is a frame period unit, a second unit, or a minute unit.

* * * * *